United States Patent [19]

Ito

[11] Patent Number: 5,761,811
[45] Date of Patent: Jun. 9, 1998

[54] ASSEMBLING METHOD FOR COOLING APPARATUS

[75] Inventor: Eiji Ito, Nagoya, Japan

[73] Assignee: Mitsubishi Denki Kabushiki Kaisha, Tokyo, Japan

[21] Appl. No.: 612,401

[22] Filed: Mar. 7, 1996

Related U.S. Application Data

[62] Division of Ser. No. 285,692, Aug. 4, 1994, Pat. No. 5,558,155.

[30] Foreign Application Priority Data

Aug. 6, 1993 [JP] Japan ................................ 5-196403

[51] Int. Cl.⁶ .................................................. B23P 15/26
[52] U.S. Cl. ............................ 29/890.054; 29/890.039
[58] Field of Search ........................ 29/890.039, 890.054, 29/890.03, 418, 428; 165/80.3; 228/183

[56] References Cited

U.S. PATENT DOCUMENTS

| | | | |
|---|---|---|---|
| 1,025,898 | 5/1912 | Beebe | 29/890.054 |
| 2,419,233 | 4/1947 | Spender | 165/80.3 X |
| 2,419,234 | 4/1947 | Holihan | 165/185 |
| 2,434,676 | 1/1948 | Spender | 165/80.3 X |
| 3,158,122 | 11/1964 | Give | 165/185 X |
| 3,334,399 | 8/1967 | Teequarden | 29/890.039 |
| 4,009,752 | 3/1977 | Wilson | 165/185 X |
| 5,038,858 | 8/1991 | Jordan et al. | |
| 5,056,590 | 10/1991 | Bohn | 165/78 |

FOREIGN PATENT DOCUMENTS

| | | | |
|---|---|---|---|
| A-048520 | 5/1992 | European Pat. Off. | |
| 3415554 | 10/1984 | Germany | 165/185 |
| 188855 | 11/1982 | Japan | 165/185 |
| 60-190047 | 12/1985 | Japan | |
| 62-25893 | 7/1987 | Japan | |
| 63-37877 | 7/1988 | Japan | |
| 2146451 | 12/1990 | Japan | |
| 318468 | 1/1991 | Japan | |
| A-2015718 | 9/1979 | United Kingdom | |

Primary Examiner—Irene Cuda
Attorney, Agent, or Firm—Sughrue, Mion, Zinn, Macpeak & Seas, PLLC

[57] ABSTRACT

A cooling apparatus having a cooling body with a plurality of fins arrayed in parallel on and fixed to a metal flat plate, wherein each of the fins is formed by bending at least one of upper and lower edge sections thereof at an angle or with notches and projections provided at multiple places in the edge sections on a line crossing the bending direction at right angles. The notch of one fin engages with the projection of the next fin when the fins are arranged in parallel on the metal flat plate.

4 Claims, 19 Drawing Sheets

F I G. 1
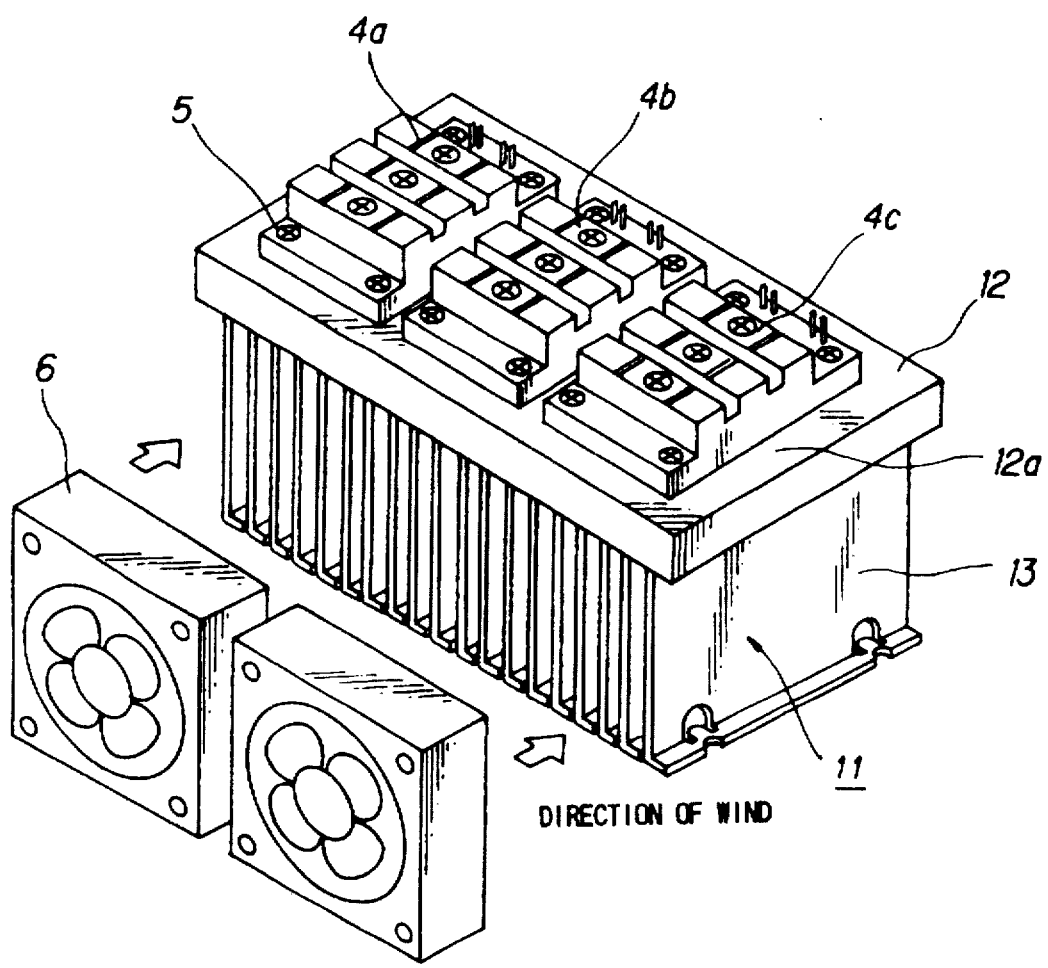

F I G. 1 2
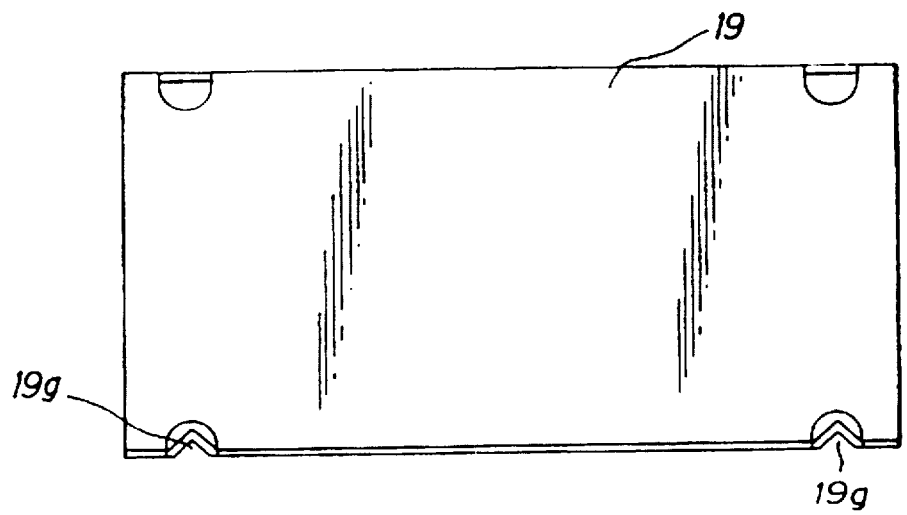

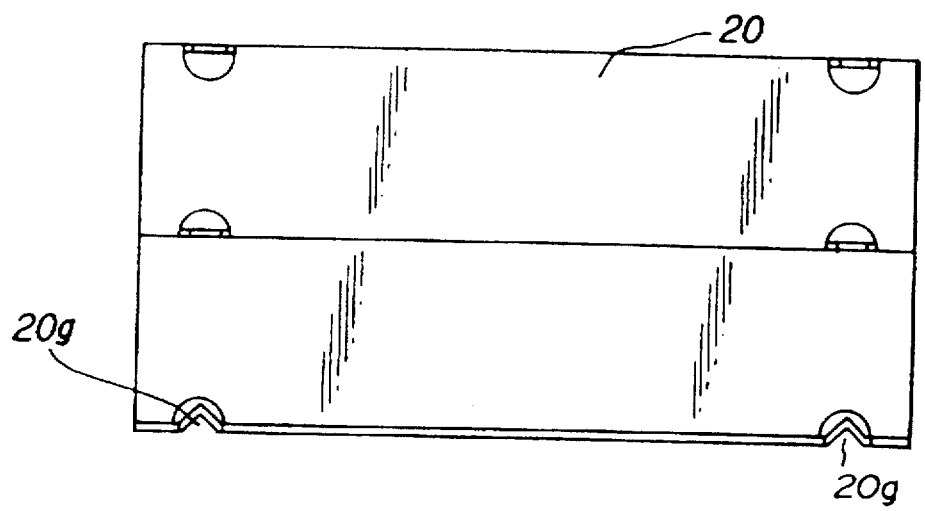
F I G. 1 5

F I G. 1 7
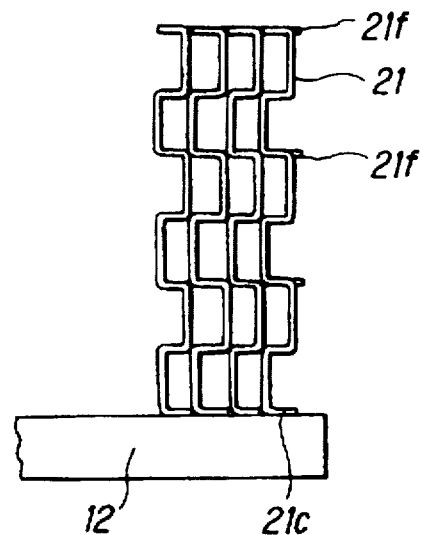
F I G. 1 8
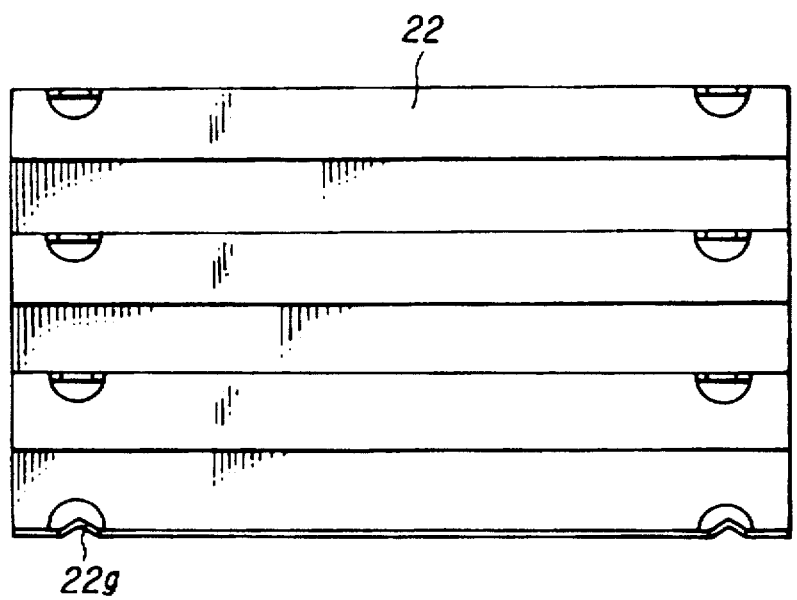

ASSEMBLING METHOD FOR COOLING APPARATUS

This is a divisional of application Ser. No. 08/285,692 filed Aug. 4, 1994, now U.S. Pat. No. 5,558,155.

FIELD OF THE INVENTION

This invention relates to a cooling apparatus and assembling method thereof for controlling temperature rise in heat-radiating parts in electronic equipment. More particularly, the invention relates to the construction of a cooling body which uses forced air to remove heat conducted from heat-radiating parts in electronic equipment.

BACKGROUND OF THE INVENTION

There is a demand for more compact and more light weight cooling apparatus as electronic equipment becomes smaller. This tendency inevitably requires more compact cooling structures. In the case of an extrusion-molded structure having a comb-shaped cross section, however, the thickness and height of the cooling fins are limited due to restrictions in the relevant fabrication processes. Specifically, there have been some technological limits that prevent the space between the fins from being made narrower and prevent the heat-radiating surface area from being made larger. For this reason, to make the heat-radiating surface area larger, generally a compact cooling body with a high cooling efficiency is made by joining a plurality of plates or fins by brazing in a vacuum.

FIG. 24 is a perspective view illustrating the configuration of a conventional cooling apparatus. FIG. 25 is a perspective view of a fin constituting the fin section shown in FIG. 24, and FIG. 26 is a side view illustrating configuration of the fin section shown in FIG. 24. In the figures, the reference numeral 1 indicates a cooling body, the reference numeral 2 indicates a flat plate made of aluminum alloy, and the reference numeral 3 indicates a fin comprising brazing sheet plates each having a core material made of aluminum alloy and a brazing material provided on one face thereof. Herein the brazing sheet is made by rolling a brazing material on one face or both faces of an aluminum plate as a core plate.

The cooling body 1 is built by providing a plurality of fins 3 on and brazing them to the flat plate 2 in a vacuum. If any defect, including bending, occurs when brazing the fins 3 in a vacuum, the surface of the flat plate 2 constituting the cooling body 2 is flattened by, for instance, scraping a mounting surface 2a on which components are mounted to overcome the defects including said bending. The reference numerals 4a, 4b and 4c indicate a semiconductor for power, which is one of parts of the heat-radiating electronic equipment, respectively, and are placed on and tightened with a screw 5 to the mounting surface 2a. The reference numeral 6 indicates a cooling fan which sends air to the fins 3 of the cooling body 1 for air-cooling.

In order to achieve the maximum cooling efficiency in the fin 3, a proper relation of the fin plate thickness (t) and inter-fin space (p) with the fin height (h) (Refer to FIG. 25 and FIG. 26) is calculated, and the brazing sheet material is bent into a ]-shaped form with the brazing material in the outer side so that the dimension of the brazing sheet material is equalized to the inter-fin space (p) as well as to the fin height (h). The ]-shaped fins 3 are arrayed in parallel on the flat plate 2 and positioned so that a cross section 3b of a shorter edge section of a ]-shape in one fin 3 contacts a surface of a brazing material 3a in the outer side of a longer edge section of another fin 3. When all the fins 3 have been arrayed in parallel on the flat plate 2, the fins 3 are temporally fixed with an appropriate tool, temperature is raised in a vacuum furnace, and a shorter edge section 3c is brazed to the flat plate 2 by means of brazing. In this manner, an integrated cooling body 1 is constructed.

Now description is made hereinafter for operations of the apparatus described above. Temperature of the semiconductors 4a, 4b and 4c, which are parts of heat-radiating electronic equipment, are raised due to heat generated during operation of the apparatus. However, the heat is conducted through bases of the semiconductors to the cooling body 1, and is emitted from the entire surfaces of the fins 3. Because a number of fins 3 are used with a narrow inter-fin space (p) in the cooling body so that the surface area becomes larger, temperature of the semiconductors 4a, 4b and 4c for power can be maintained at an allowable level by forcefully sending cooling air to between the fins 3 by the cooling fan so that heat radiated from the surfaces of the fins 3 is conducted to the atmosphere.

Technological documents relating to this invention include the Japanese Patent Laid Open Publication No. 18468/1991 disclosing a "Method of Connecting Heat Sinks", the Japanese Utility Model No. 71984/1982 disclosing a "Stacked Heat Exchanger", the Japanese Patent Publication No. 37877/1988 disclosing a "Radiator", the Japanese Utility Model Publication No. 25893/1987 also disclosing a "Radiator", the Japanese Utility Model Laid Open Publication No. 190047/1985 disclosing a "Radiator", and the Japanese Utility Model Laid Open Publication No. 146451/1990 disclosing a "Radiator for Electronic Elements".

In the conventional type of cooling apparatus as described above, there are several problem arise. First, when arranging in parallel and brazing the ]-shaped fins to a flat plate, an appropriate tool must be used for positioning (temporally fixing) the ]-shaped fins to the flat plate. Second, when arranging in parallel the ]-shaped fins on a flat plate and temporally fixing them to the flat plate by means of brazing, as an edge face of one fin contacts a surface of a brazing material of another fin, if the brazing material is melted, a clearance is generated between fins. The clearance makes it difficult to accurately stack and fix the fins. The brazing process also may generate a displacement or fall of the fins, which in turn will make it impossible to braze the fins in their erect posture at correct positions. As a result, the working efficiency of the assembly becomes lower.

SUMMARY OF THE INVENTION

It is an object of the invention to provide a cooling apparatus which enables positioning of fins without using any tool and can maintain the fins in their erect posture at correct positions by eliminating displacement or falling of the fins and raise the working efficiency in making a cooling body.

In a cooling apparatus according to the present invention having a cooling means with a plurality of fins arrayed in parallel on and fixed to a metal plate, each of the fins is formed by bending upper and lower edge sections thereof at the specified angle in the same direction (]-shaped fins), notches and projections are arranged on a line crossing the bending direction at right angles at multiple places in the upper and lower shorter edge sections thereof, and the notches of one fin engage with the projections of another fin when the fins are arrayed in parallel on the metal plate.

Also in a cooling apparatus according to the present invention having a cooling means with a plurality of fins arrayed in parallel on and fixed to a metal plate, each of the fins is bent to a Z-shaped form, notches and projections are arranged on a line crossing the bending direction at right angles at multiple places in the lower shorter edge sections thereof, and the notches of one fin engage with the projections of another fin when the fins are arrayed in parallel on the metal plate.

Also in the cooling apparatus according to the present invention having a cooling means with a plurality of fins arrayed in parallel on and fixed to a metal plate, each of the fins is formed into a S-shaped form, notches and projections are arranged on a line crossing the bending direction at right angles at multiple places in the upper, middle and lower shorter edge section, and the aforesaid notches on one fin engage with the projections of another fin when the fins are arrayed in parallel on the metal plate.

Also in the cooling apparatus according to the present invention having a cooling body with a plurality of fins arrayed in parallel on and fixed to a metal plate, each of the fins is formed into a corrugated state, notches and projections are arranged on a line crossing the bending direction at right angles and at multiple positions in each of the shorter edge sections, and the notches of one fin engage with projections of another fin when the fins are arrayed in parallel on the metal plate.

Also, sections for collecting a brazing material are arranged in the notches and the projections formed in each shorter edge section of each of the fins.

Also in the cooling apparatus according to the present invention having a cooling body with a plurality of fins arrayed in parallel on and fixed to a metal plate, grooves each with the inner side opened are arranged at the two edge sections of the metal plate, each of the fins is bent into a ]-shaped form, notches and projections are arranged at both edges of the upper and lower shorter edge sections thereof, and the fins are arrayed in parallel by inserting the both edges of each of the fins into the grooves of the metal plate.

In the cooling apparatus according to the present invention, when notches and projections in shorter edge sections of the ]-shaped fins are stacked, they engage with each other, and the edge faces having no brazing material contact each other, so that the fins can be positioned in the longitudinal and lateral directions.

Also In the cooling apparatus according to the present invention, when notches and projections in the lower edge sections of Z-shaped fins are stacked, they engage with each other, the edge faces each having no brazing material contact each other, and also because an edge face of the upper edge contact a surface having no brazing material thereon, each fin can be positioned in both the longitudinal and lateral directions.

Further, in the cooling apparatus according to the present invention, when notches and projections in shorter edge sections of the S-shaped fins are stacked, they engage with each other, and the edge faces having no brazing material contact each other, so that the fins can be positioned in the longitudinal and lateral directions.

Furthermore, in the cooling apparatus according to the present invention, when notches and projections on shorter edge sections of rectangular corrugate fins, then engage with each other, and the edge faces each having no brazing material thereon contact each other, so that positioning in both the longitudinal and lateral directions is possible.

Furthermore, in the cooling apparatus according to the present invention, in addition to positioning of fins, when the brazing material is melted down, surplus of the melted brazing material is collected in the sections for collecting brazing material arranged at multiple places in each contact face with the base surface, which prevents the melted brazing material from flowing out of the base surface.

Also in the cooling apparatus according to the present invention, grooves each with the inner side opened are provided in the two edge sections of the metal plate, so that the cooling apparatus can easily be assembled by inserting the fins from the side of the edge face without using a tool for stacking.

Other objects and features of this invention will become understood from the following description with reference to the accompanying drawings.

BRIEF DESCRIPTION OF THE DRAWINGS

FIG. 1 is a perspective view illustrating the entire configuration of a cooling apparatus according to the present invention;

FIG. 12 is a front view illustrating a fin according to the present invention;

FIG. 15 is a front view illustrating the configuration of a fin according to the present invention;

FIG. 17 is a front view illustrating the cooling body shown in FIG. 16;

FIG. 18 is a front view illustrating the configuration of a fin according to present invention;

DESCRIPTION OF THE EMBODIMENTS

Figure 2:
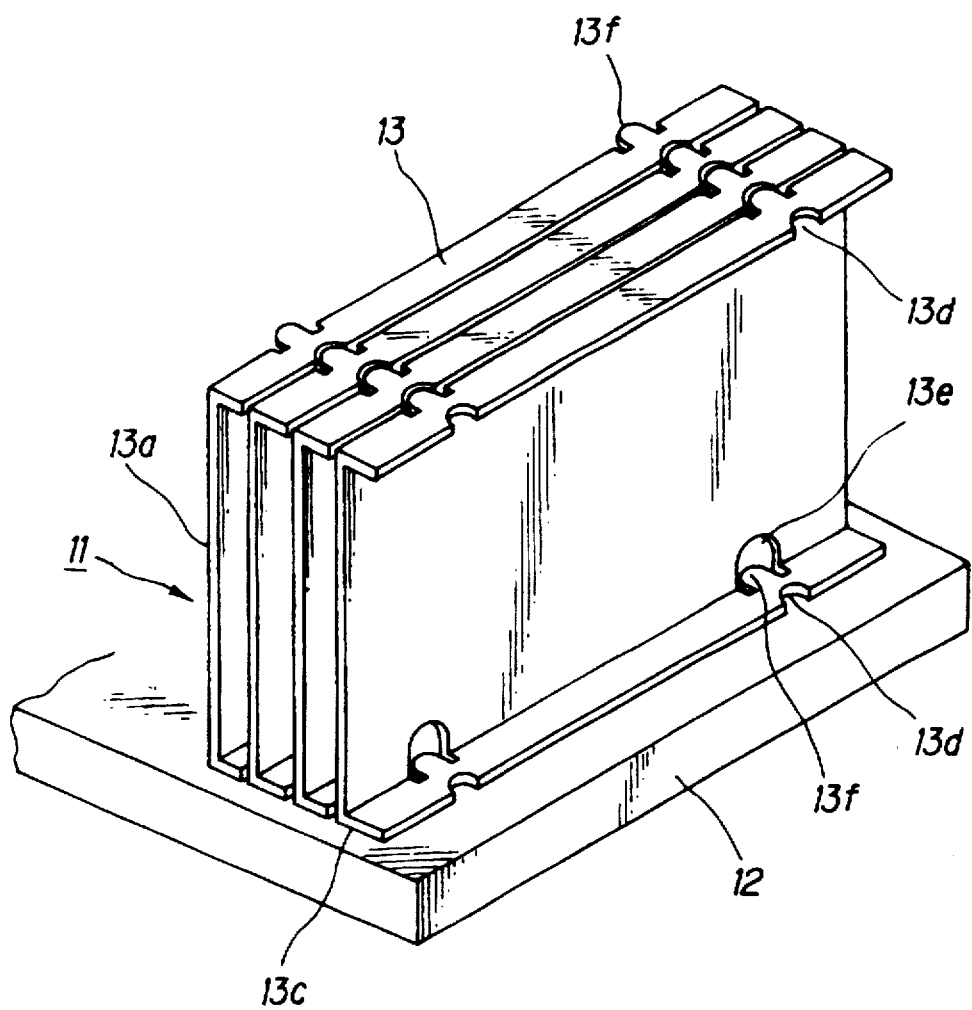
FIG. 2 is a perspective view illustrating a configuration of the cooling body shown in FIG. 1.
Figure 3:
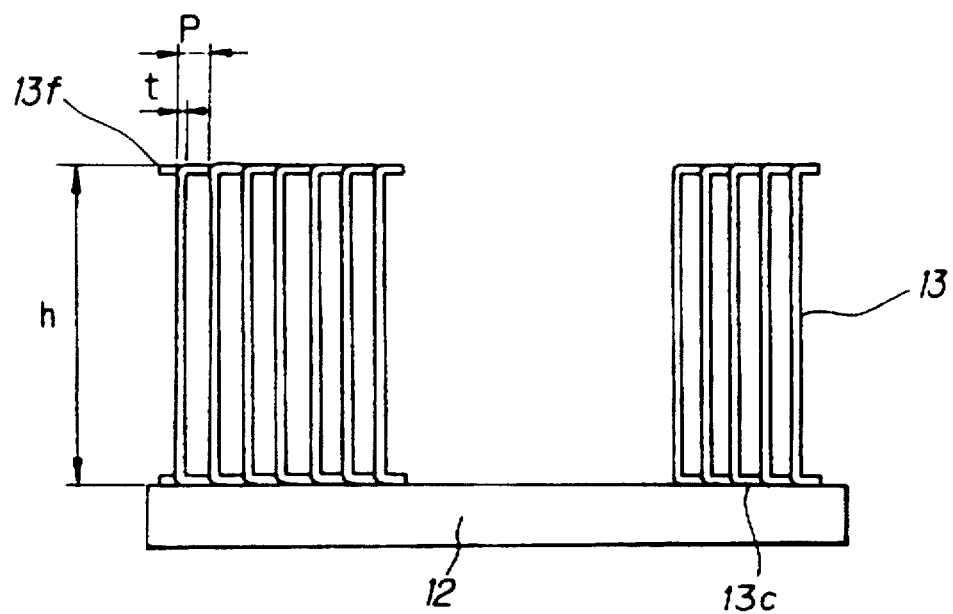
FIG. 3 is a side view illustrating a configuration of the cooling body shown in FIG. 1.
Figure 4:
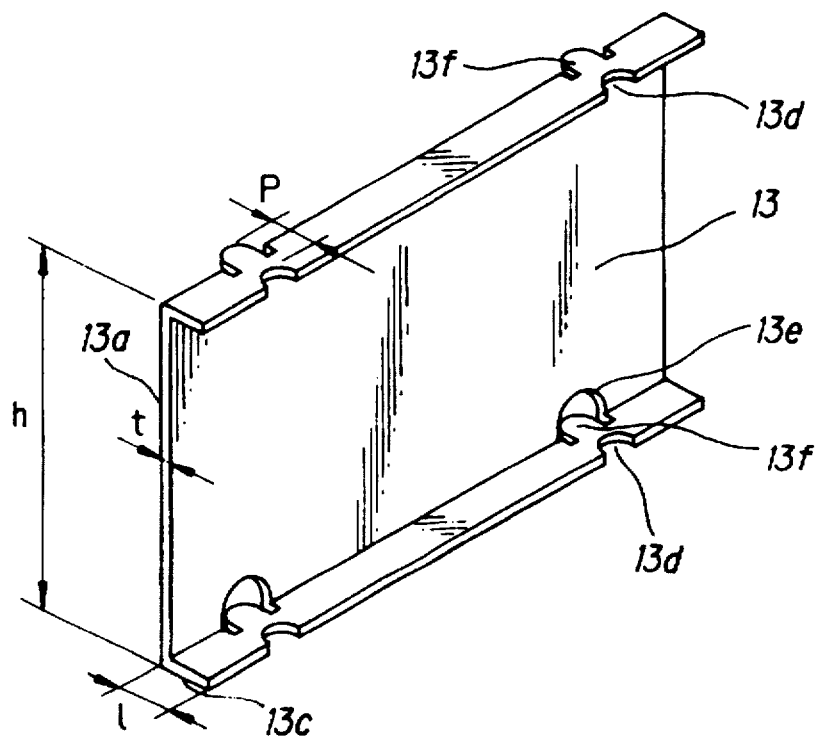
FIG. 4 is a perspective view illustrating a configuration of the fin shown in FIG. 1.
Figure 5A:
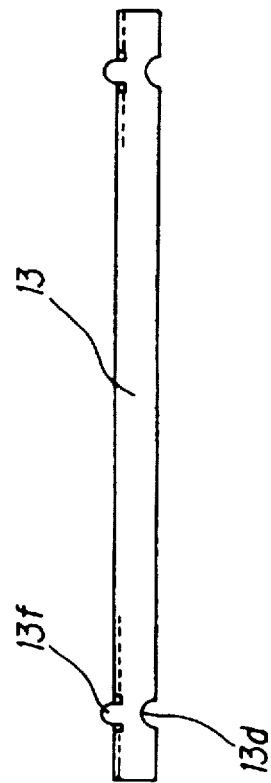
FIGS. 5A, 5B and 5C are illustrating a configuration of the fin shown in FIG. 1.
Figure 5B:
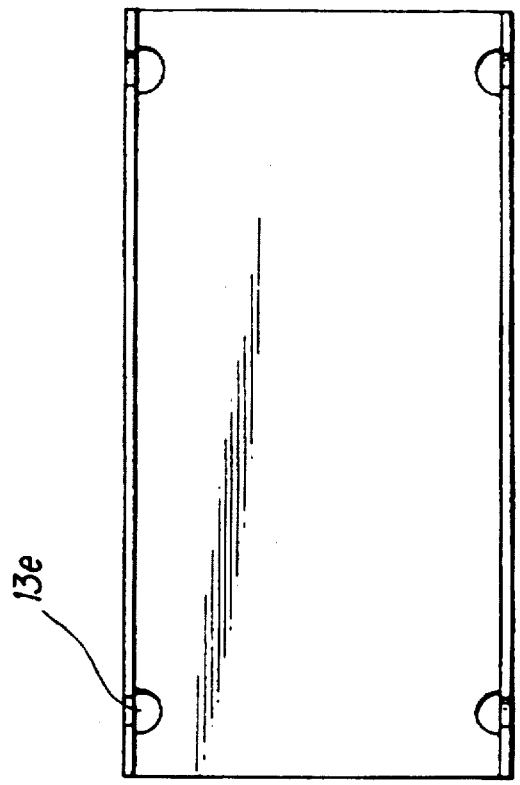
Figure 5C:
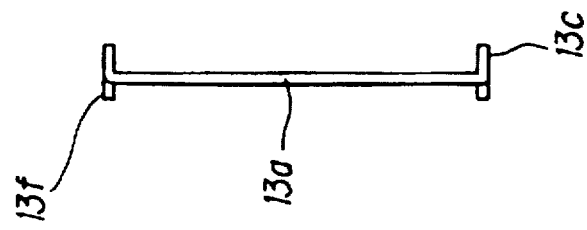

Now description is made hereinafter for preferred embodiments of the present invention with reference to the related drawings. FIG. 1 is a perspective view illustrating the entire configuration according to a first embodiment of the present invention, FIGS. 2 and 3 are a perspective view and a side view illustrating a key section of a cooling body used in the cooling apparatus shown in FIG. 1 respectively, and FIGS. 4 and 5 are a perspective view and a parts drawing illustrating a fin constituting a fin section respectively. It should be noted that, in FIGS. 1 and 2, the reference numerals 4a to 4c, 5 and 6 are the same numerals used in the figures illustrating a conventional type of cooling apparatus because they are assigned to identical or equivalent sections. Accordingly, a description of these sections is omitted here.

In FIG. 1, the reference numeral 11 indicates a cooling body, the reference numeral 12 indicates a flat plate made of aluminum alloy, that the reference numeral 12a indicates a mounting surface on which power semiconductors 4a, 4b and 4c are mounted, and the reference numeral 13 indicates a fin made by punching a brazing sheet plate having a core material made of aluminum alloy and a brazing material provided on one side thereof and by bending the punched plate. The cooling body 11 is assembled by arranging in parallel a plurality of fins 13 on and brazing them to the flat plate 12 in a vacuum. In order to maximize the cooling efficiency of the fins 13, a relation of the fin thickness (t) and inter-fin space (p) with the fin height (h) is calculated to decide the dimension.

The fin 13 for cooling is made by pressing and punching a brazing sheet with a brazing material provided on one face thereof and bending the punched sheet plate into a ]-shaped form, having a short upper edge section, middle section and short lower edge section, so that the side of brazing material 13a is at the outer side of the form (left side in the figures). The reference numeral 13d indicates one of arced notches arranged at two places at the edge of the upper and lower edge sections respectively. The reference numeral 13e indicates a semicircular hole formed in the middle section on the same line as the notch 13d, and the numeral 13f indicates a curved projection which is left when the upper and lower edge sections are bent into a ]-shaped form. The dimension from a top of the projection 13f of the fin 13 from a top of the notch 13d is set to a pitch p between the fins 13. In contrast to it, the dimension of each of the upper and lower shorter edge sections of a ]-shaped fin is set so that the length l is smaller than the pitch p between the fins 13 (l<p).

A bend direction is defined by the edge interface between the upper edge section and the middle section. A similar bend direction is formed by the interface of the lower edge section and the middle section. The notches and projection are formed so that they are perpendicular to the bend direction. In this manner, when the fins 13f are stacked, the projection 13f engages with the notch 13d of the next fin, and edge faces of the fins pressed and punched out contact each other, so that positioning can be carried out in both the longitudinal and lateral directions. Accordingly, erect fins which are not inclined in the assembled state can be obtained without being affected by the brazing material.

When the fins 13 are stacked on and temporarilly fixed to the flat plate 12, if a tool with a bolt (not shown) having an outer diameter which coincides with a diameter of each of the four holes 13e in the middle section of the fin 13 is used, the fins 13 can easily be stacked on the flat plate 12 by setting each fin 13 onto a bolt. After a specified number of fins 13 have been stacked, the fins 13 temporarilly fixed are temporarilly tightened onto the flat plate 12, the temperature is raised in a vacuum furnace and the fins are permanently fixed, when the brazing material of the lower edge section 13c is melted down and each fin is brazed to the flat plate 12. In this manner, the integrated cooling body 11 is easily built.

Now description is made hereinafter for operations of the apparatus described above. Although temperature of the power semiconductors 4a, 4b and 4c which are parts of a heat-radiating equipment, is raised due to heat generated during operation of the apparatus, the heat is conducted through bases of the semiconductors to the cooling body 11, and is emitted from the entire surface of the fins 13. In each of the fins 13, the inter-fin space (p) is narrow and a number of fins 13 are used therein to make the surface area larger, so that temperature of the power semiconductors 4a, 4b and 4c can be maintained at an allowable level or below by forcefully sending cooling air between the fins 13 with the cooling fan 6 and conveying heat emitted from the surface of the fin 13 to the atmosphere.

Figure 6:
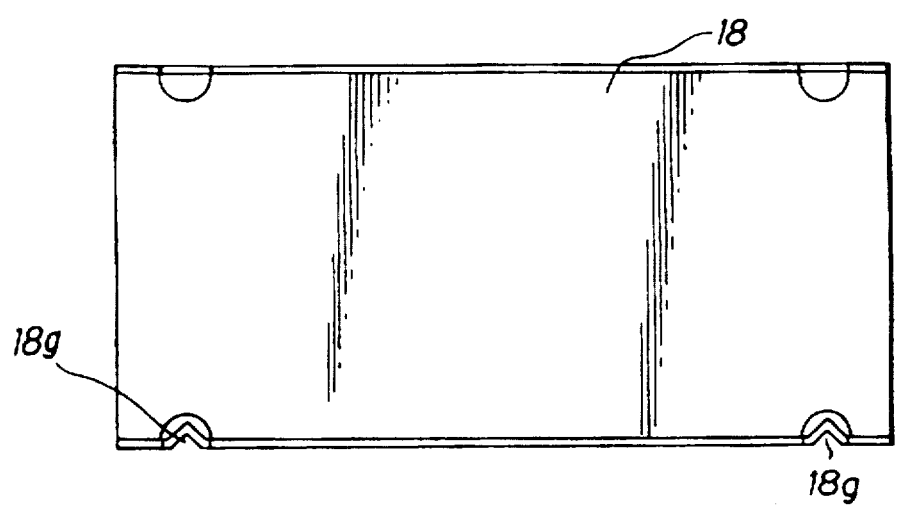
FIG. 6 is a front view illustrating a configuration of a fin according to the present invention.

Now a description is made herein after for a second embodiment of the present invention. The second embodiment is made by partially changing the fins shown in the first embodiment of the present invention. Namely, in a fin 18, as shown in FIG. 6, inverted V-shaped concave sections 18g each facing the inner side of the ]-shaped space are provided on the line drawn between the projection 13f and the notch 13d (see FIG. 5a) in the lower edge section of the fin 18. When the fin 18 is brazed in a vacuum to the flat plate 12, a brazing material on the brazing sheet plate is melted down, but as the concave sections 18g are provided near the two edge sections between the flat plate 12 and the fin 18, the brazing material is collected in the V-shaped sections 18g, which prevents the brazing material from flowing out to the outside.

Figure 7:
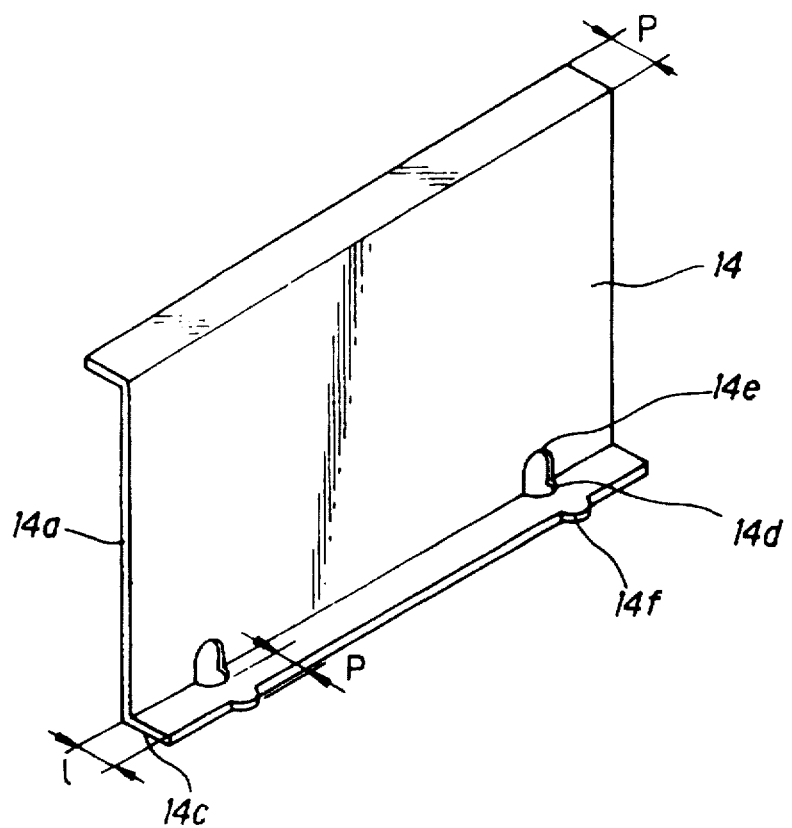
FIG. 7 is a perspective view illustrating the configuration of a fin according to the present invention.
Figure 8:
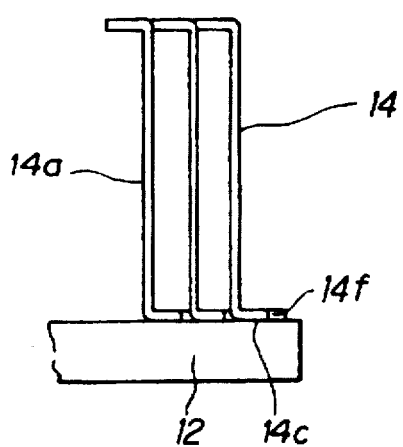
FIG. 8 is a side view illustrating a cooling body using the fins shown in FIG. 7.

Now description is made hereinafter for a third embodiment of the present invention. The third embodiment is made by changing a form of the fin shown above in relation to the first embodiment. The same reference numerals are assigned to the same sections as those in the first embodiment, and a description concerning the sections is omitted herein. In FIG. 7 and FIG. 8, a fin 14 is made by pressing and punching out a one-sided brazing sheet plate and bending the punched sheet material into a Z-shaped form, having an upper edge, middle and lower edge sections, so that the side with a brazing material 14a comes to the left side of FIG. 8. A hole is drilled at the location of the edge formed by the middle and lower edge sections. The reference numeral 14d indicates a semicircular arced through-hole provided in the bent section of the shorter lower edge section, the reference numeral 14e indicates a semicircular arced through-hole in the larger middle section communicating to the semicircular through-hole 14d, and the reference numeral 14f indicates a semicircular arced projection provided in the lower edge section and positioned for alignment with the through-hole 14d. The dimension from a tip of the semicircular arced projection of the fin 14 to a tip of the through-hole is set with a pitch p between the fins 14. Also the length of the upper shorter edge section is set with the pitch p, but the length l of the lower shorter edge section is set to have a dimension less than the pitch p (l<p).

When the fins 14 are stacked, the arced projection 14f of the shorter lower edge section engages with the through-hole 14d of the next fin 14 and edge faces of the fins contact each other, so that positioning of the fins can be carried out in both the longitudinal and lateral directions. Also as an edge face of the shorter upper edge section contacts a surface of the next fin 14 having no brazing material thereon, and for this reason positioning in the lateral direction can be carried out and the fins 14 can be formed into an erect state not inclining in the assembled state without being affected by the brazing material.

Figure 9:
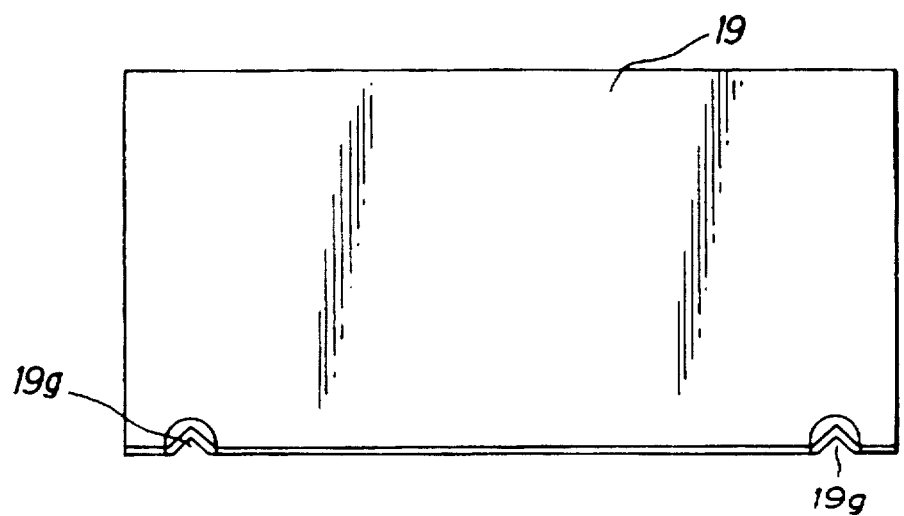
FIG. 9 is a front view illustrating the configuration of a fin according to the present invention.

Now description is made hereinafter for a fourth embodiment of the present invention. The fourth embodiment is made by partially changing the fin shown in relation to the third embodiment. Namely, in a fin 19, as shown in FIG. 9, inverted V-shaped concave sections 19g, each facing the inside of the Z letter-shape, are provided on the line drawn between the projection 14f and the notch 14d (see FIG. 7) in the lower shorter edge section of the fin 19.

Figure 10:
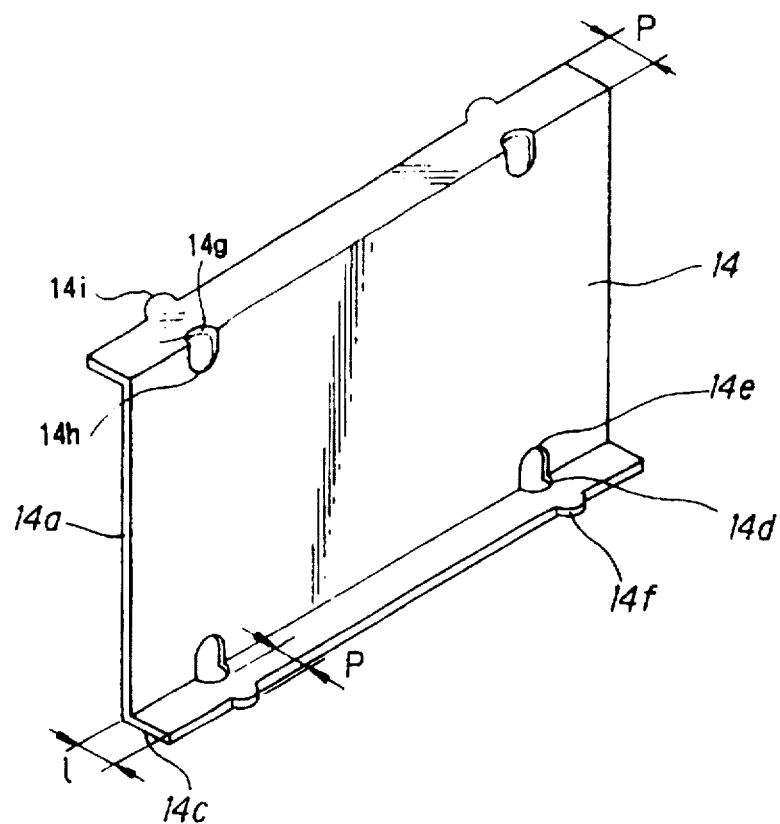
FIG. 10 is a perspective view illustrating the configuration of a fin according to the present invention.
Figure 11:
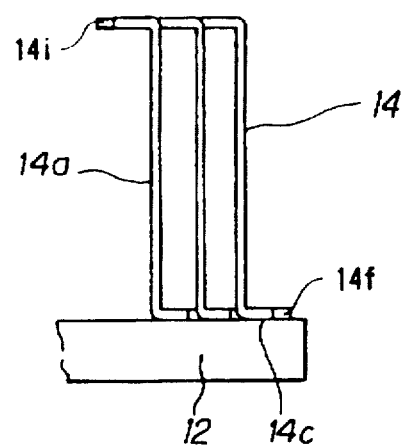
FIG. 11 is a side view illustrating a cooling body using the fin shown in FIG. 10.

Next description is made for the fifth embodiment. In the fifth embodiment, there are forms corresponding to the semicircular through-hole 14d provided in the lower bent section, the semicircular arced through-hole 14e provided in the longer middle section and communicating to the semicircular through-hole 14d above, and a semicircular projection 14f provided on an edge of the lower section on the same line as the semicircular through-hole 14d. Also, similar structures also are the upper shorter section. The same reference numerals are assigned to the same sections as those in the third embodiment above, so that the description thereof is omitted herein. In FIG. 10 and FIG. 11, the fin 14 is obtained by bending the one side brazing sheet material worked by punching into a Z-shaped form with the brazing material 14a at the left side of the Figures and the punched section at the lower side.

In this figure, the reference numeral 14d indicates a semicircular through-hole provided in the lower shorter edge section, 14e indicates a semicircular arced through-hole provided in the longer middle section and communicating with the semicircular through-hole, 14f indicates a semicircular projection provided in the edge of the lower edge section and disposed on the same line as the semicircular through-hole 14d on the lower edge section. Furthermore, the reference numeral 14g indicates a semicircular through-hole provided in the shorter upper edge section, 14h indicates a semicircular through-hole provided in the middle section and in communication with the semicircular through-hole 14g, and 14i indicates a semicircular projection provided in the edge face side on the same line as the semicircular through-hole 14g provided on the upper shorter edge section. A dimension between the tip of the circular projection and a tip of the through-hole is set to the pitch p between the fins 14.

When the fins 14 are stacked, the circular projection 14f on the edge of the lower edge section engages the through-hole 14d of the next fin 14 and the two edge faces contact each other, so that positioning in both the vertical and horizontal directions can be carried out. Also the semicircular projection 14i on the edge of the upper edge section engages the through-hole 14g of the next fin 14, and the two edge faces contact each other, so that positioning in both the vertical and horizontal directions can be carried out. As a result, fins 14 can be built into an erect state having no inclination when in an assembled form.

Now description is made hereinafter for a sixth embodiment of the present invention. The sixth embodiment is made by partially changing the fin shown in relation to the fifth embodiment. Namely, as shown in FIG. 12, in a fin 19, inverted V-shaped concave sections 19g, each facing the inside of the Z-shaped space, are provided on a line drawn between the projection 14f and the notch 14d (see FIG. 10) in the lower shorter edge section of the fin 19.

Figure 13:
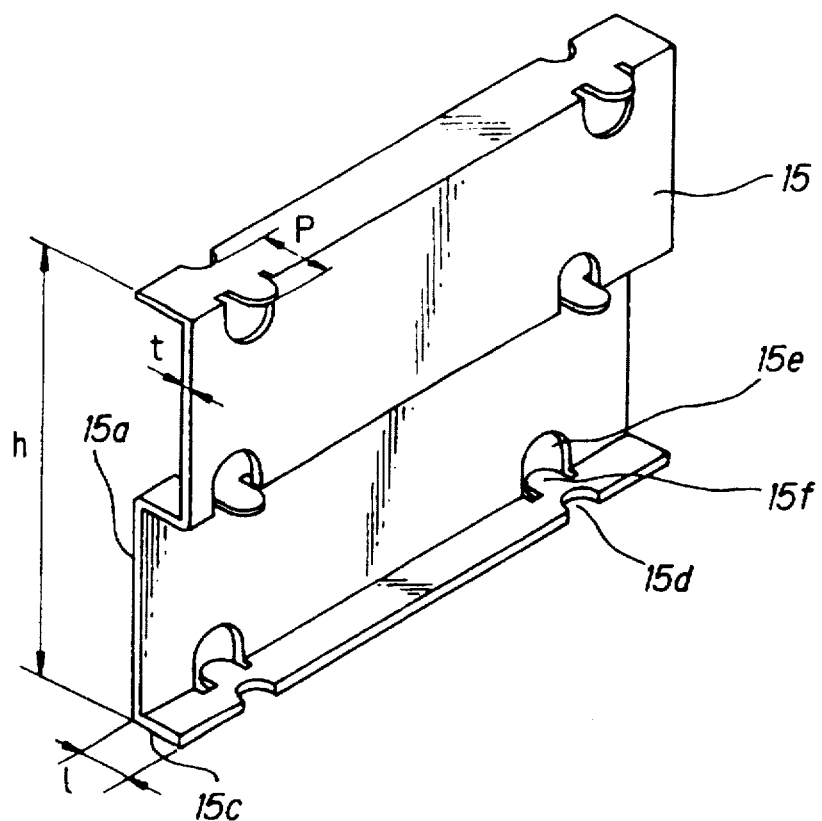
FIG. 13 is a perspective view illustrating a fin according to the present invention.
Figure 14:
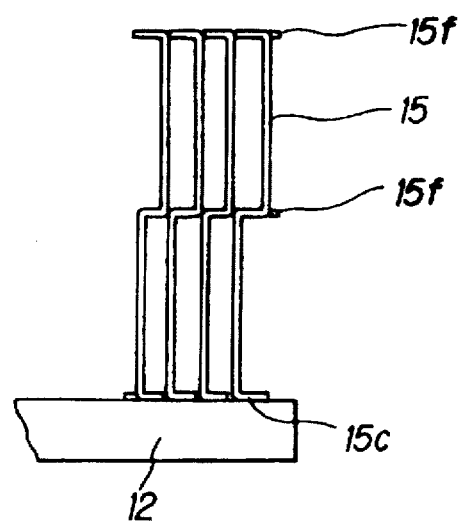
FIG. 14 is a side view illustrating a cooling body using the fins shown in FIG. 13.

Now description is made hereinafter for a seventh embodiment of the present invention. The seventh embodiment is made by changing a form of the fin shown in relation to the first embodiment, and the same reference numerals are assigned to the same sections as those in the first embodiment, so that description concerning the sections is omitted herein. In FIG. 13 and FIG. 14, a fin 15 is made by pressing and punching a one-sided brazing sheet plate and bending the punched sheet plate into an angular corrugated form. The structure has a short upper edge section, a short lower edge section, two long middle sections and short intermediate section therebetween. The side of the fin with a brazing material 15a comes to the left side of the figure. The reference numeral 15d indicates arced notches provided at two places in each of the shorter upper edge, intermediate and lower edge sections respectively. The reference numeral 15e indicates a semicircular hole aligned with the notch 15d, and the reference numeral 15f indicates an arced projection left on the shorter upper edge, intermediate and lower edge sections when the brazing sheet plate is bent into a S-shaped form. The relationship between the arced projection 15f, notch 15d and length l is same the relationship shown in aforesaid first embodiment.

When the fins 15 are stacked, the projection 15f of one fin engages with the notch 15d of the next fin and edge faces of the two fins contact each other, so that positioning in both the longitudinal and lateral directions can be carried out, and for this reason the fins 15 can be formed into the erect state not inclining in the assembled state without being affected by the brazing material.

Now description is made hereinafter for an eighth embodiment of the present invention. The eighth embodiment is made by partially changing the fin shown in relation to the seventh embodiment. Namely, in a fin 20, as shown in FIG. 15, inverted v-shaped concave sections 20g each facing the inside of the S-shaped form are provided on a line drawn between the projection 15f and the notch 15d in the lower shorter edge section of the fin 20.

Figure 16:
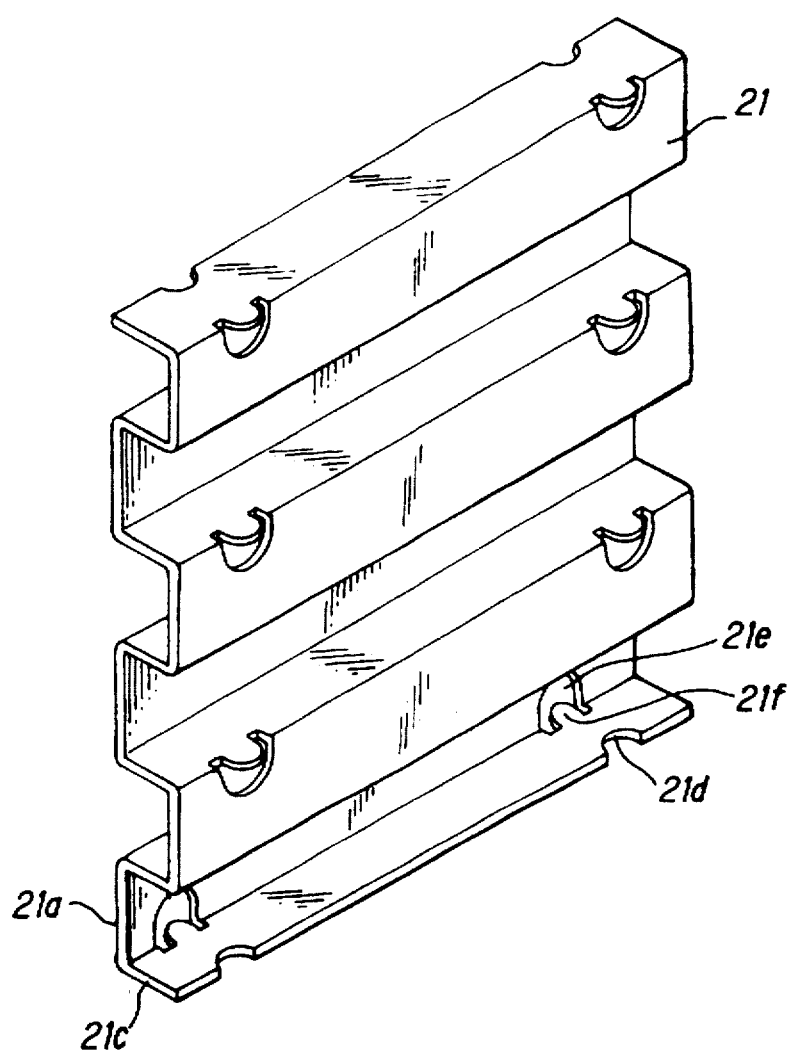
FIG. 16 is a perspective view illustrating the configuration of a fin.

Next, a description is provided for the ninth embodiment of the present invention. The ninth embodiment is obtained by changing a form of the fin shown in the first embodiment, and the same reference numerals are assigned to the same portions as those in the first embodiment, so that description there of is omitted herein. In FIG. 16 and FIG. 17, the fin 21 is formed by bending a one side brazing sheet material into a rectangular corrugated form with the brazing material 21a in the left side. In this figure, at the reference numeral 21d is an arced notch provided at two points on four short edges, at 21e a semicircular hole notched on the same line as the notch 21d, and at 21f is an arced projection left when the lower edge section is formed by binding.

When the fins 21 are stacked, the projection 21f engages the notch 21d of the next fin and the edge faces of the two components contact each other, so that positioning in both the vertical and horizontal directions is possible, and the fins 21 assembled with each other can be built up into an erect state having no inclination without being influenced by the brazing material.

Next description is made for the tenth embodiment of the present invention. The tenth embodiment was obtained by partially working the fin shown in the ninth embodiment above. Namely, the fin 22 has a reverse V-shaped concave section 22g concaved in the inner direction with a corrugated form provided on the line of the projection 21f and notch 21d in the lower short edge section of the fin 21, as shown in FIG. 18.

Figure 19:
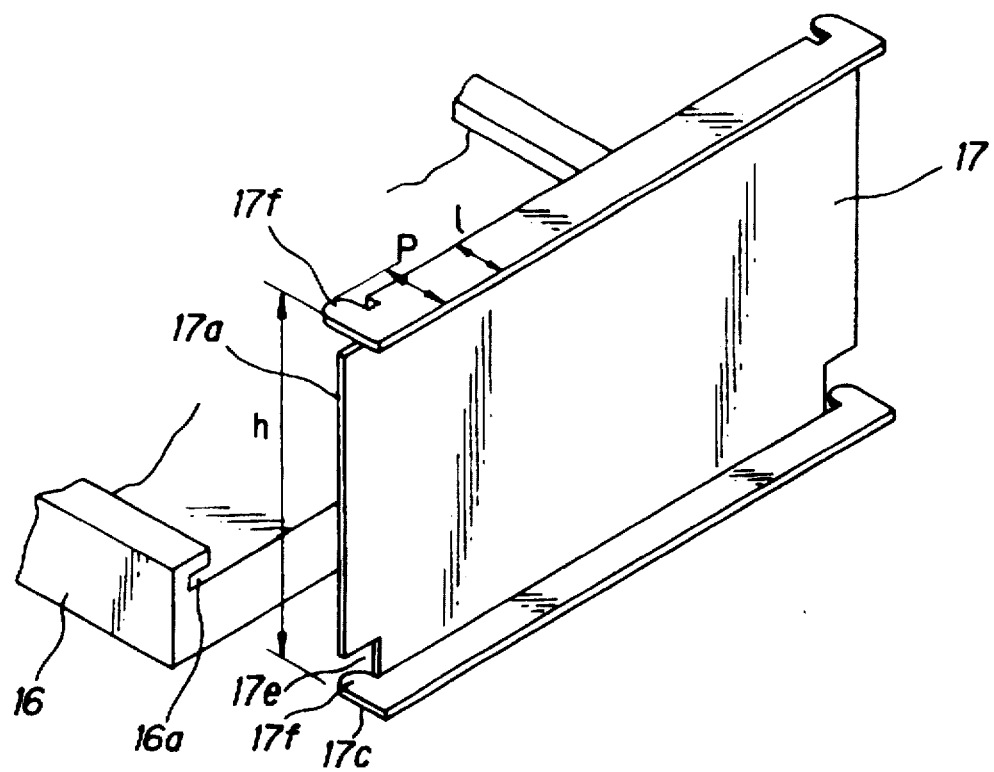
FIG. 19 is a perspective view illustrating a configuration of the fin according to the invention.
Figure 20:
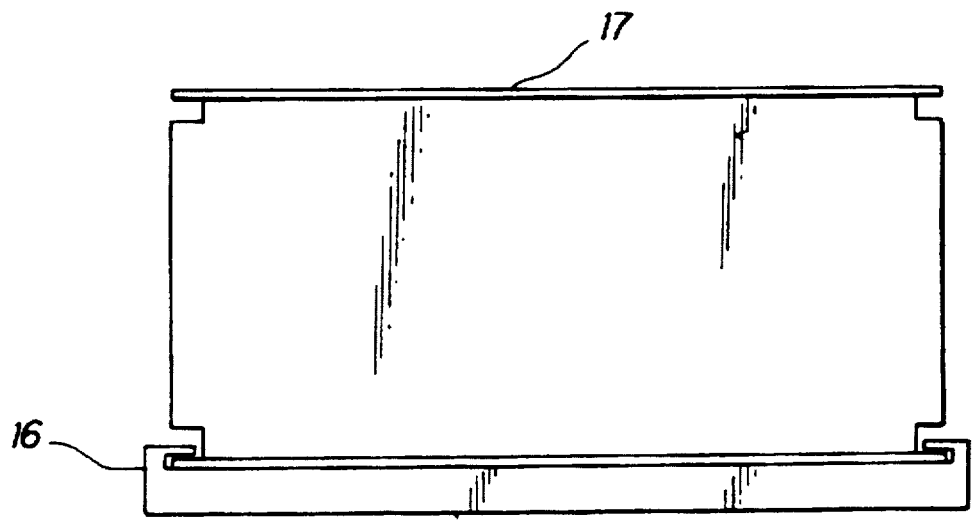
FIG. 20 is a front view illustrating configuration of the cooling body shown in FIG. 19.

Next description is made for the eleventh embodiment of the present invention. The eleventh embodiment is obtained by changing a combination of the forms of the fin and flat plate as shown in the first embodiment above. In FIGS. 19 and 20, the reference numeral 16 indicates a extrusion-molded aluminum plate, and the groove 16a with the both edges opened into the inner direction thereof is provided in the edge face in the extruding direction. The reference numeral 17 indicates a fin manufactured by bending the one side brazing sheet material worked by punching into a ]-shaped form with the brazing material 17a in the outer side so that it will contact the surface of plate 16. The reference numeral 17e indicates a notch provided at both edges of the fin 17, and the reference numeral 17f indicates an arced projection left when the upper and lower shorter edges are bent into a ]-shaped form. A dimension from a tip of the projection 17f of the fin 17 to the shorter edge is set to a pitch p between the fins 17. In contrast, a length l of the shorter edge of the ]-shaped form is set so that the length is smaller than the pitch p between the fins 17 (l<p).

When the fins 17 are stacked, the fin 17 is inserted from an edge face of the flat plate 16 as a base for the aluminum extrusion-molded material into the groove 16a. As a result, an edge face of the projection 17f of the next fin contacts the shorter edge of the fin 17, and positioning in the horizontal direction can be performed without being influenced by the brazing material. In horizontal positioning, a width dimension of the fin 17 and a dimension of the groove of the flat plate 16 as a base for the aluminum extrusion-molded material can be adjusted, so that the fins 17 can easily be stacked without using a tool such as a bolt. Also the fins 17 can be fixed by pressing the upper section of the flat plate 16 at the two edge sections by such a tool as a press after the fins 17 are assembled onto the flat plate 16.

Figure 21:
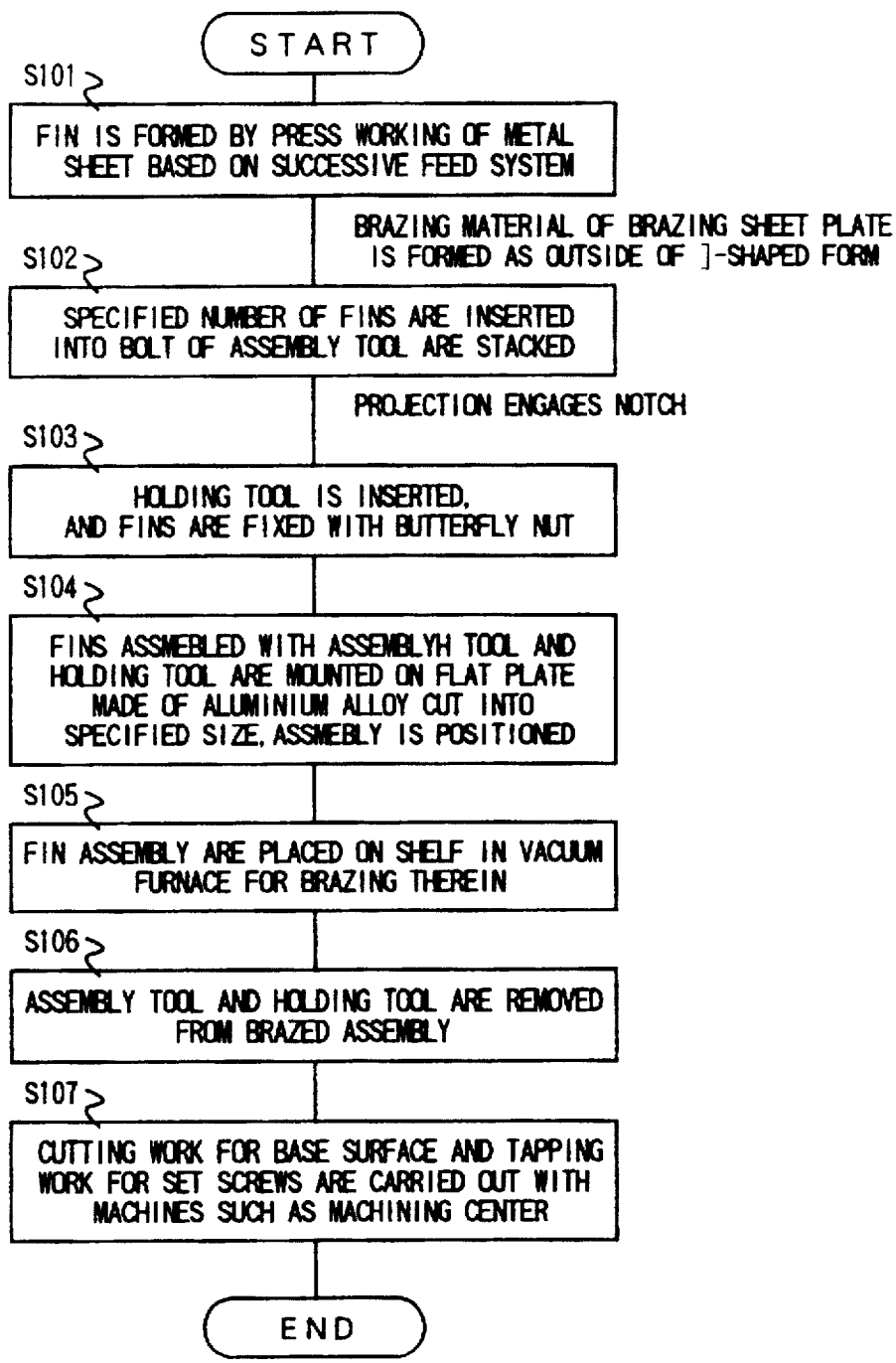
FIG. 21 is a flow chart illustrating an assembling method of the cooling body.
Figure 22:
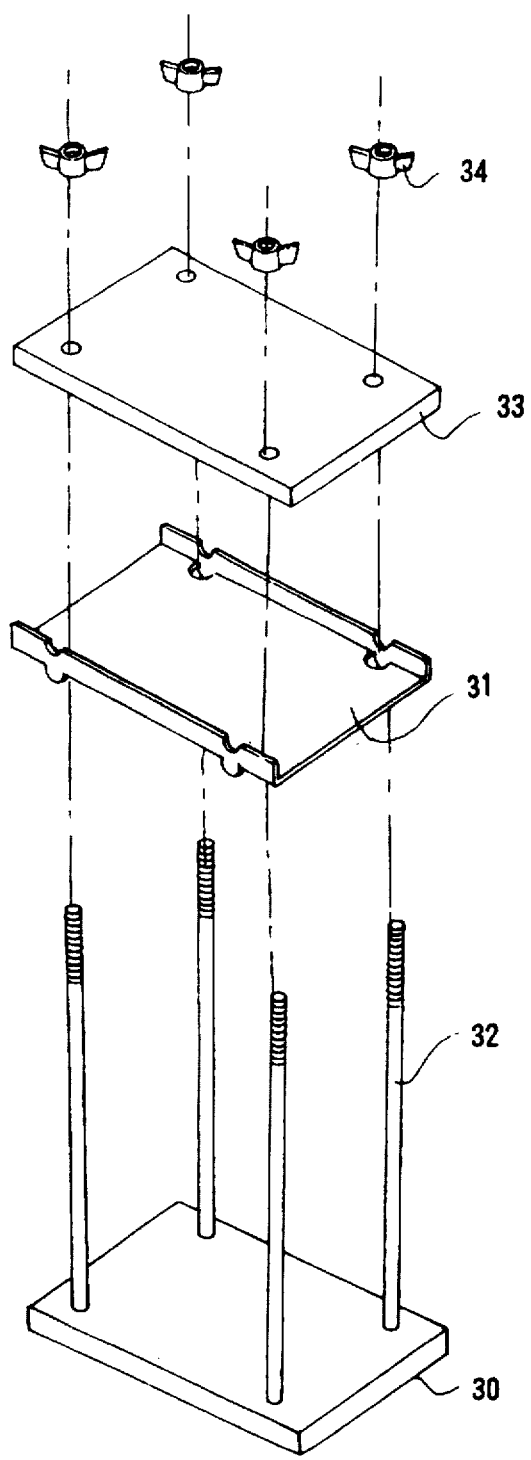
FIG. 22 is a explanatory view illustrating an assembling operation in accordance with flow chart shown in FIG. 21.
Figure 23:
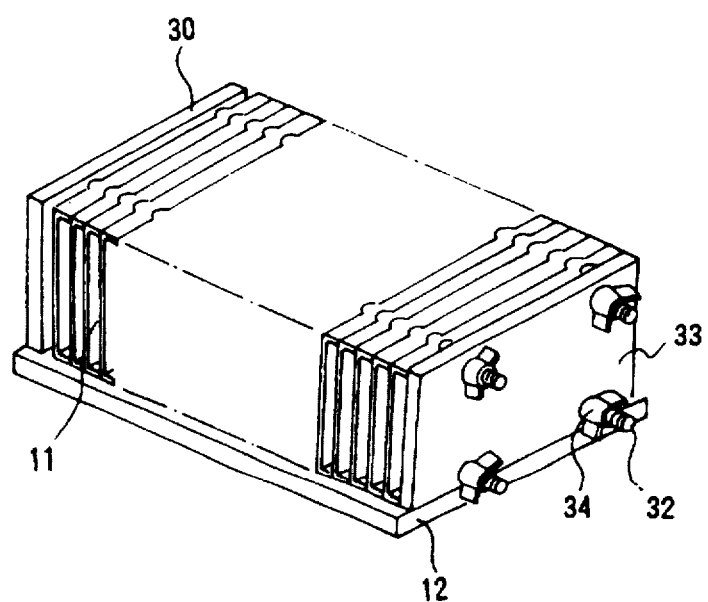
FIG. 23 is a explanatory view illustrating an assembling operation in accordance with flow chart shown in FIG. 21.
Figure 24:
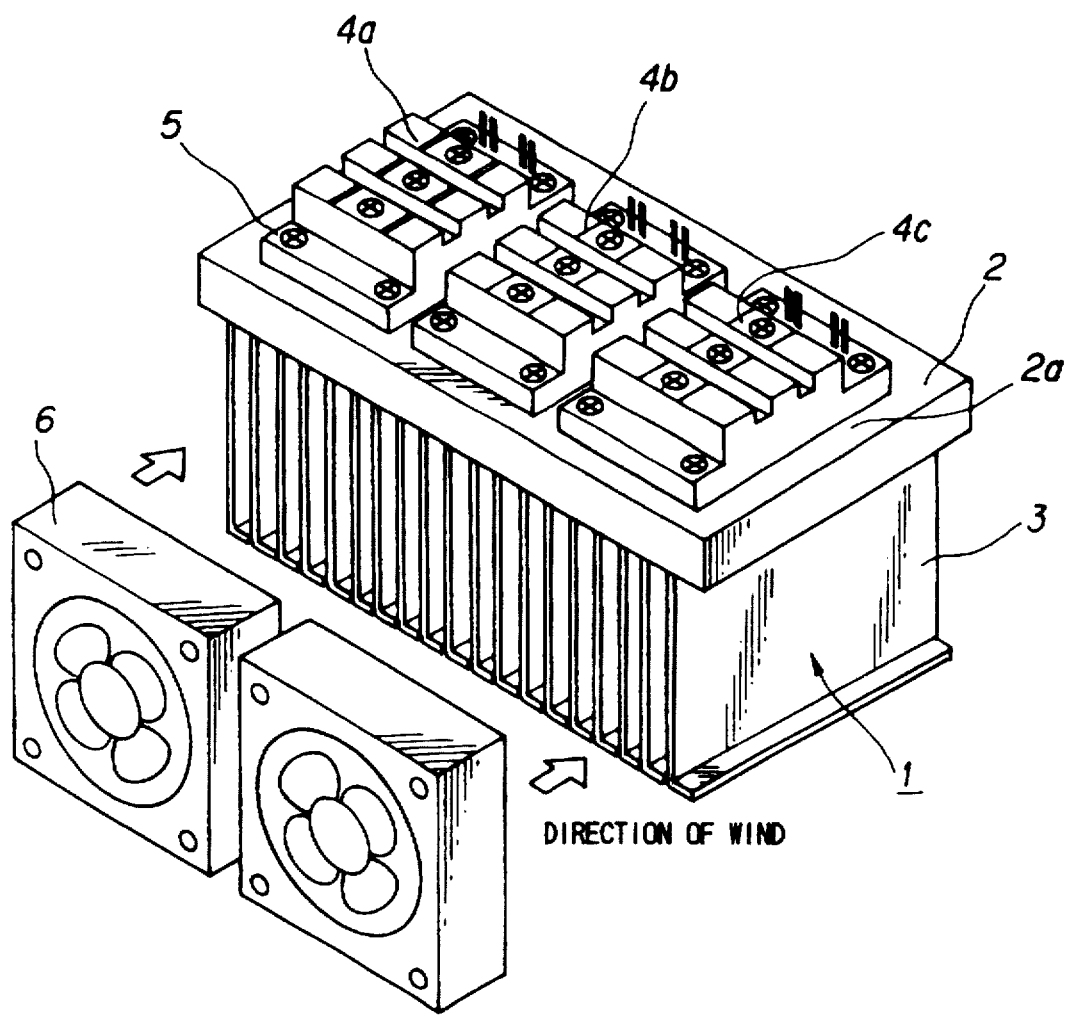
FIG. 24 is a perspective view illustrating the entire configuration of a conventional type of cooling apparatus.
Figure 25:
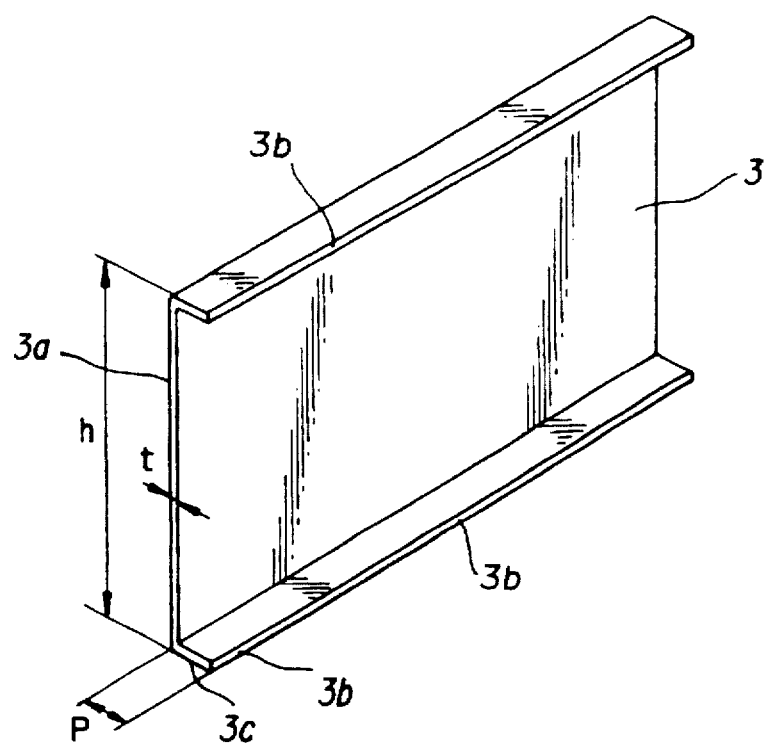
FIG. 25 is a perspective view illustrating a configuration of the fin shown in FIG. 24.
Figure 26:
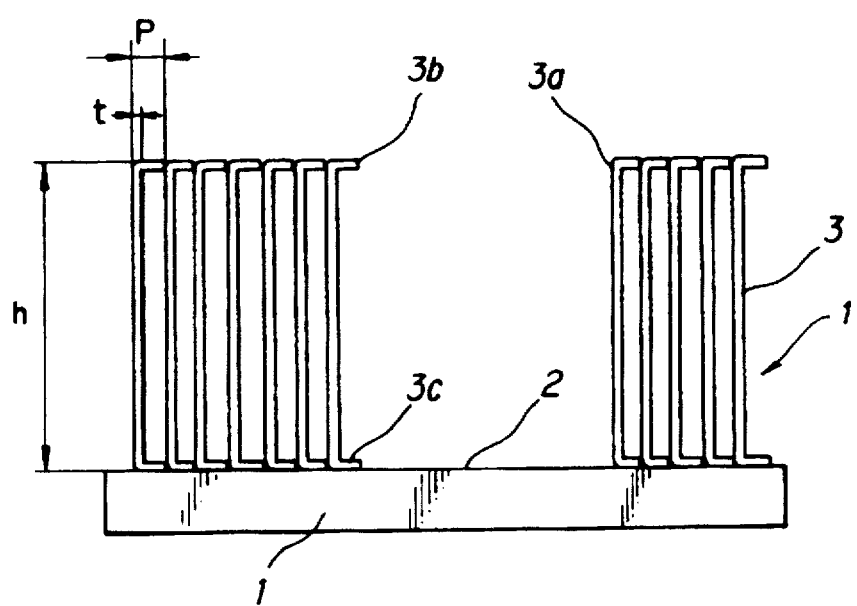
FIG. 26 is a side view illustrating a configuration of the cooling body shown in FIG. 24.

Next a description is made for the method of assembling the cooling apparatus above. FIG. 21 is a flow chart illustrating a method of assembling the cooling apparatus, and FIG. 22 and FIG. 23 are explanatory views each illustrating the operations required in assembly. The same reference numerals are assigned to the same sections as those in the first embodiment, and the description thereof is omitted herein. At first, a fin 31 is formed by press working of metal sheet based on a successive feed system (S101). Herein a brazing material of a brazing sheet plate is punched and formed in a desired shape (]-shape, Z-shape, S-shape etc.) with appropriate holes and projections. Then, a specified number of fins 31 are inserted into a bolt 32 of the assembly tool 30 are stacked (S102), a holding tool 33 is inserted, and the fins 31 are fixed with a butterfly nut 34 (S103).

Then the fins 31 assembled with the assembly tool 30 and the holding tool 33 are mounted on the flat plate 12 made of aluminum alloy cut into a specified size, the assembly is positioned (S104), and the fin assembly are placed on a shelf in a vacuum furnace for brazing therein (S105). Then the assembly tool 30 and the holding tool 33 are removed from the brazed assembly (S106), and cutting work for the base surface and a tapping work for set screws are carried out with machines such as a machining center (S107), thus a series of processing being finished.

In each of the embodiments, each of projections and notches of a fin has an arced form, but the same effect can be obtained also when the projections and notches are formed into a V-shaped form or a trapezoid form and are engaged with each other. Also, even if the projections and notches are located at opposite positions, the same effect can be obtained. Furthermore, although each of the embodiments of the present invention was described using a one-sided brazing sheet plate, the same effect can be obtained by using a double-sided brazing sheet plate so long as it has the same form as the one-sided brazing sheet plate.

As described above, in the cooling apparatus according to the present invention, each of the cooling fins comprises a brazing sheet plate bent into a ]-shaped form for surface contact with an aluminum base, so that a large brazing area can be secured with an improved brazing accuracy and a cooling body with a high thermal conductivity can be obtained. Also, as the cooling fin is bent into a ]-shaped form with arced projections and arced notches provided in the upper and lower shorter edge sections and semicircular holes each for making a projection in the longer edge section, when cooling fins are stacked, the fins can easily be stacked only by inserting a bolt into the tool, which enables positioning, and also as edge faces contact each other, a high precision cooling fin which is not deformed can be obtained without being affected by the brazing material.

Also as the cooling fin may have a Z-shaped form with arced projections and arced notches provided in the lower shorter edge section and semicircular holes for notching provided in the longer edge section, and in addition as the upper shorter edge section is not processed at all, fabrication of this type of cooling fin is very easy, and furthermore because of the Z-shaped form, pressed and punch sheet plates can be stacked for storage not requiring any space other than the combined thickness of the sheet plates.

Also as the cooling fin may have an S-shaped form with arced projections and arced notched provided in the upper, middle and lower edge sections, warping or deformation will never occur at a central section of a fin having a large height, so that a larger surface area can be obtained, which insures a higher heat radiation efficiency.

Furthermore as the cooling fin may have a angular corrugated form with arced projections and notches provided in the shorter edge section, warping or deformation will never occur at the central section of a fin having a large height, and also a lattice-shaped cooling body with a small pitch and a high heat radiation efficiency can be obtained.

Also as inverted V-shaped concave sections may be provided at 2 places in the shorter edge section of the cooling fin and a clearance with a base flat plate may be provided, when brazing is carried out in a vacuum, this construction prevents the brazing material from flowing out to the outside, and a high precision cooling fin can be obtained.

Furthermore as the grooved base flat plate comprising an extrusion-molded aluminum material and the cooling fin may be bent into a ]-shaped form respectively with notches provided at the two edges, the cooling fin can be inserted into a groove section of the base flat plate without using any tool, so that assembly is quite easy.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An assembling method for a cooling apparatus comprising the steps of:

providing a plurality of fins, each of said fins having plural through holes;

inserting plural bolts of an assembly tool through said through holes to position said fins in a parallel fin arrangement;

positioning a holding tool in contact with an outermost fin and temporarily securing said holding tool to said bolts;

positioning said parallel fin arrangement assembled with said assembly tool and said holding tool on a flat plate;

brazing said parallel fin arrangement to said flat plate to form a brazed assembly; and removing said assembly tool and said holding tool from said brazed assembly.

2. An assembling method for a cooling apparatus comprising the steps of:

providing a plurality of fins, each of said fins having opposed side edge support portions;

providing a metal plate with a flat surface and opposed side support structures, said support structures having grooves formed therein for receiving said opposed side edge support portions;

for each of said fins, inserting said side edge support portions into said grooves of said side support structures, such that said fins are positioned to form a parallel fin arrangement; and brazing said parallel fin arrangement to said flat surface.

3. An assembly method for a cooling apparatus according to claim 2, further comprising the step of:

forming projections and notches in each of said fins, such that upon assembly of said parallel fin arrangement said projections and notches of adjacent fins mate with one another.

4. An assembling method for a cooling apparatus according to claim 2, wherein the step of providing a metal plate includes cutting an aluminum alloy material into a specified size and shape.

* * * * *